United States Patent [19]

Moriyama et al.

[11] Patent Number: 4,860,082
[45] Date of Patent: Aug. 22, 1989

[54] BIPOLAR TRANSISTOR

[75] Inventors: Masatoshi Moriyama; Masaki Ohira, both of Tokyo, Japan

[73] Assignee: NEC Corporation, Tokyo, Japan

[21] Appl. No.: 60,259

[22] Filed: Jun. 10, 1987

Related U.S. Application Data

[62] Division of Ser. No. 762,867, Aug. 6, 1985, Pat. No. 4,695,328.

[30] Foreign Application Priority Data

Jul. 8, 1984 [JP] Japan ................. 59-165268

[51] Int. Cl.[4] ............... H01L 27/12; H01L 29/72; H01L 29/04
[52] U.S. Cl. ......................... 357/49; 357/34; 357/59
[58] Field of Search .................. 357/49, 34, 59 H

[56] References Cited

U.S. PATENT DOCUMENTS

| | | | |
|---|---|---|---|
| 3,648,125 | 3/1972 | Peltzer | 357/51 |
| 3,947,299 | 3/1976 | Weijland et al. | 357/59 H |
| 4,199,378 | 4/1980 | van Gils | 357/49 |
| 4,396,933 | 8/1983 | Magdo et al. | 357/59 H |

Primary Examiner—Rolf Hille
Assistant Examiner—Robert P. Limanek
Attorney, Agent, or Firm—Burns, Doane, Swecker & Mathis

[57] ABSTRACT

A semiconductor device comprises a semiconductor substrate, an active region positioned in a portion of the substrate and a field insulating layer surrounding the active region and partially embedded in the substrate. The semiconductor device according to the present invention further comprises an insulating member positioned under and attached to the bottom of the field insulating layer and surrounding the active region with the field insulating layer. Because of this insulating member, the thickness of the field insulating layer can be reduced to a small value. Therefore, a PN junction formed in the active region can be terminated at the insulating member without any sharp curvature, that is, the PN junction can extend flatly. Further, silicon crystal near the field insulating layer has only a small amount of defects or no defect so that any abnormal diffusion of impurity near the field insulating layer can be prevented. An element such as a bipolar transistor formed in the active region can realize an increased breakdown voltage.

11 Claims, 4 Drawing Sheets

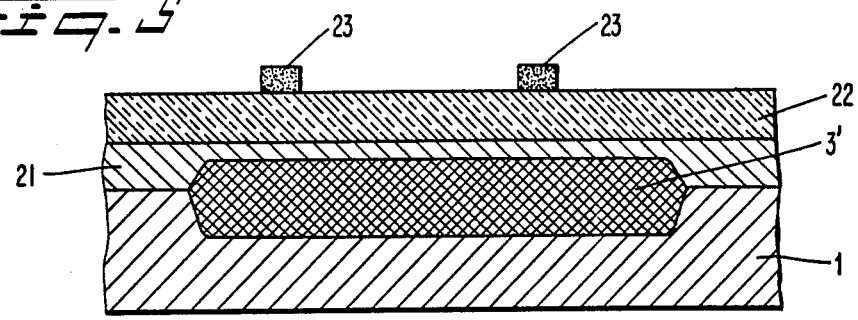
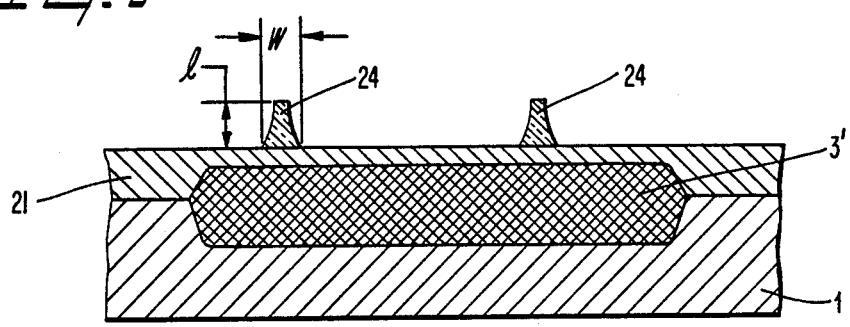
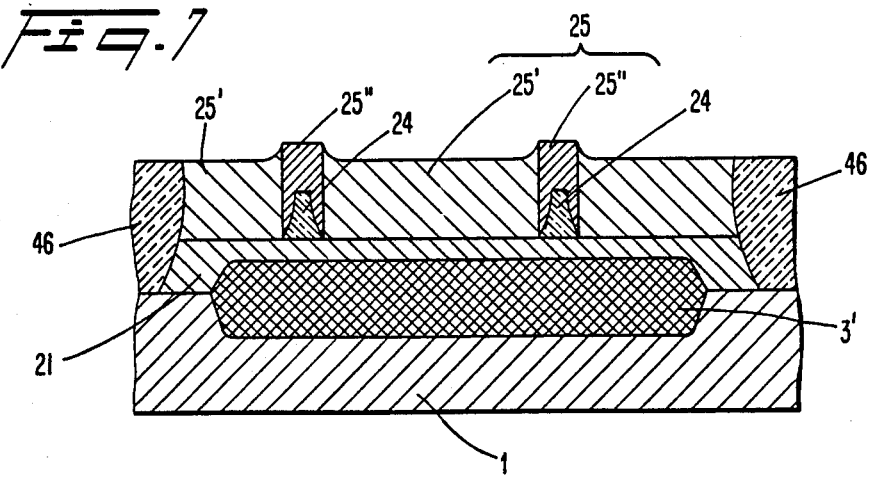

BIPOLAR TRANSISTOR

This application is a divisional of application Ser. No. 762,867, filed on Aug. 6, 1985, now U.S. Pat. No. 4,695,328.

BACKGROUND OF THE INVENTION

The present invention relates to a semiconductor device and method of manufacturing the same, and more particularly to an integrated circuit device having a bipolar transistor and a method of manufacturing thereof.

Heretofore, a bipolar transistor element has been formed adjacent to a thick field insulating layer which is partially buried in a semiconductor substrate. In the bipolar transistor element, both the base and emitter regions are terminated at the buried portion of the thick field insulating layer. In this case, the PN junction between the base region and the collector region has a sharp curvature in the vicinity of the field insulating layer. Therefore, the breakdown voltage ($BV_{CBO}$) between the base region and the collector region becomes a low value because of the sharp curvature of the PN junction. Further, when the field insulating layer is deeply buried into the substrate, silicon crystals near the buried insulating layer include many defects, and therefore, impurities for forming impurity regions are unsuitably deeply diffused along the field insulating layer. The lattice defects of the silicon substrate have more influence on phosphorus atoms for forming the emitter region rather than on boron atoms for forming the base region. Consequently, the base width along the thick field insulating layer becomes narrower than that of the designed value, and a high breakdown voltage ($BV_{CEO}$) between the emitter region and the collector region cannot be expected.

SUMMARY OF THE INVENTION

An object of the present invention is to provide a semiconductor device having impurity regions to form at least one PN junction with a high breakdown voltage therebetween.

Another object of the present invention is to provide a method of manufacturing the effective semiconductor device mentioned above.

According to one feature of the present invention, there is provided a semiconductive device comprising a semiconductor substrate, a field insulating layer partially buried in the semiconductor substrate and substantially surrounding an active region of the semiconductor substrate, an insulating member attached to at least a part of a bottom of peripheral portion of the field insulating layer and terminating at least a part of the active region, and an impurity region provided in the active region, the impurity region being formed from a surface of the active region into a predetermined depth of the active region such that the bottom of the impurity region is terminated at the insulating member.

According to another feature of the present invention, there is provided a semiconductor device comprising a semiconductor body of one conductivity type, a first semiconductor layer of the opposite conductivity type formed on the semiconductor body, a second semiconductor layer of the opposite conductivity type formed on the first semiconductor layer and having an PN junction forming region, a first insulating layer selectively formed on the surface of the second semiconductor layer, the first insulating layer partially embedded in the surface of the second semiconductor layer and surrounding the PN junction forming region of the second semiconductor layer, a second insulating layer formed within the second semiconductor layer positioned between the bottom of the first insulating layer and the first semiconductor layer, the second insulating layer surrounding the PN junction forming region, and a first impurity region such as a base region of a bipolar transistor of the one conductivity type formed in the PN junction forming region of the second semiconductor layer such that the PN junction between the first impurity region and the second semiconductor layer surving as a collector region of the transistor is terminated at the second insulating layer. Favorably, the insulating member or the second insulating layer has a trapezoid shape, and the width of 1.0 μm to 2.0 μm and the height of 0.5 μm to 1.0 μm. The field or first insulating layer favorably has the thickness of 0.5 μm to 0.8 μm, and is buried from the semiconductor substrate 0.2 μm to 0.35 μm.

According to an another aspect of the present invention, there is provided a method of manufacturing

BRIEF DESCRIPTION OF THE DRAWINGS

FIGS. 5 to 9 are cross-sectional views partially showing process steps for manufacturing a semiconductor device of an embodiment according to the present invention;

BRIEF DESCRIPTION OF THE EMBODIMENTS

Figure 1:
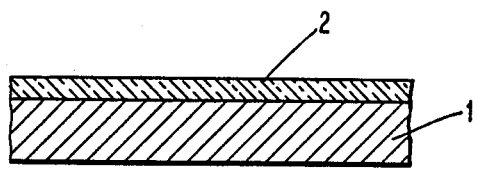
FIGS. 1 to 3 are cross-sectional views partially showing process steps for manufacturing a semiconductor device in a prior art.
Figure 2:
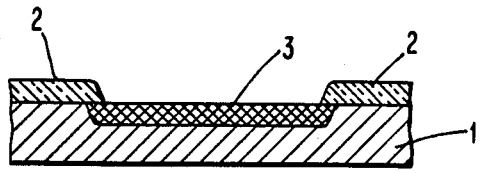
Figure 3:
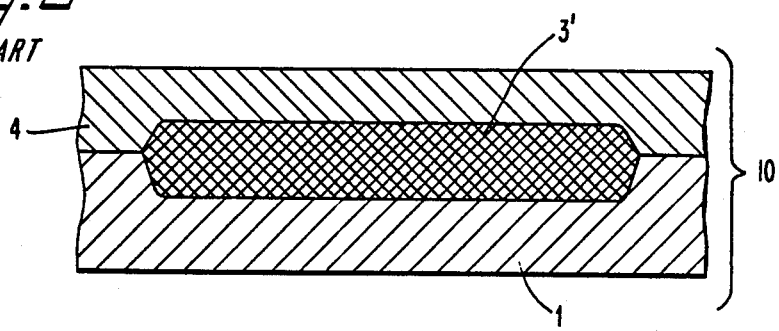
Figure 4:
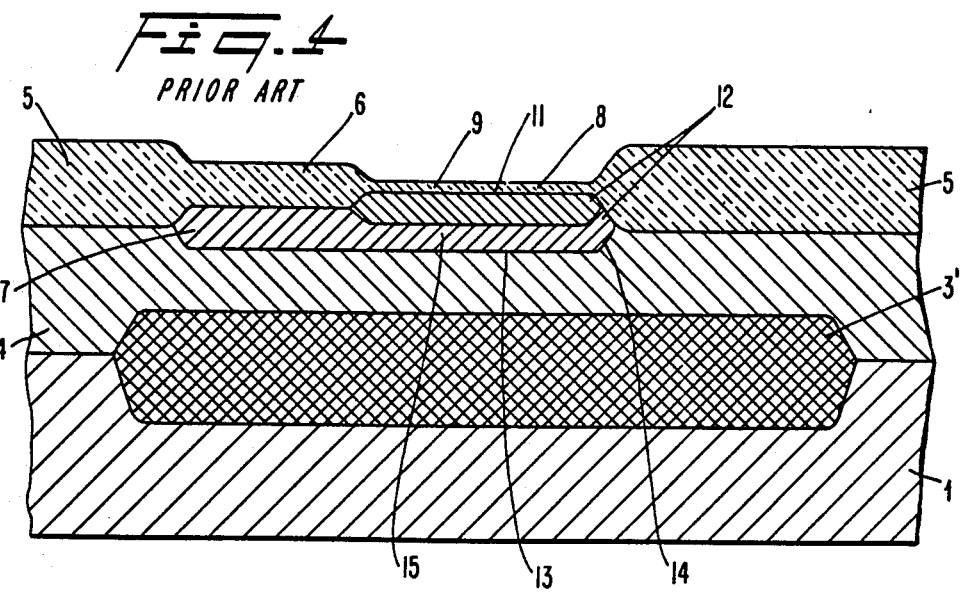
FIG. 4 is a cross-sectional view showing the semiconductor device in the prior art.
Figure 8:
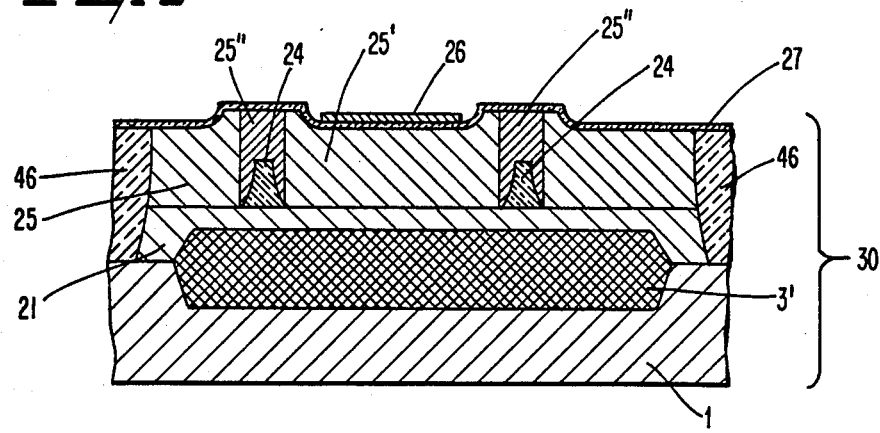
Figure 9:
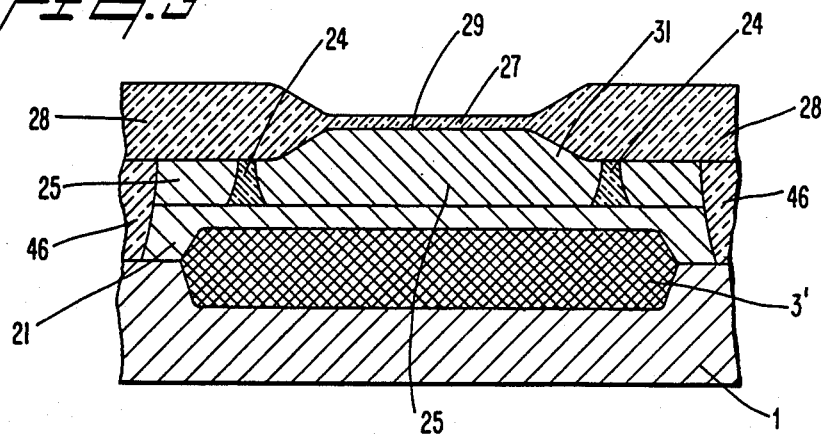
Figure 10C:
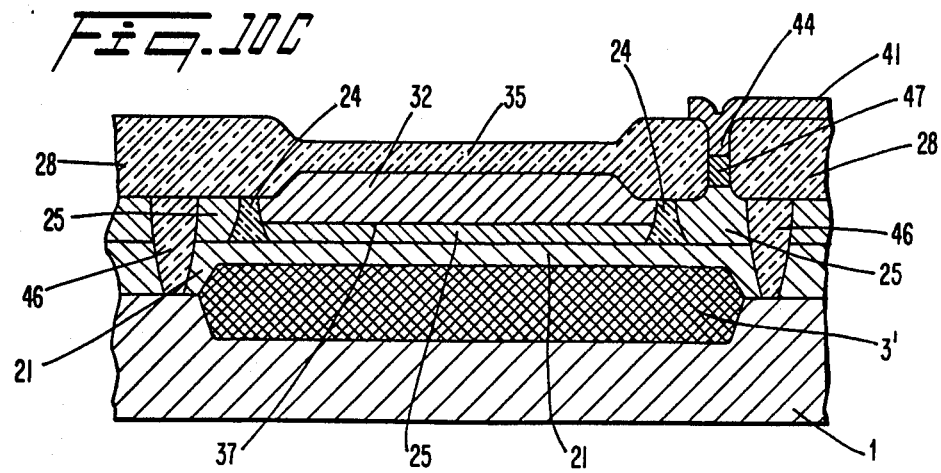
FIG. 10B and FIG. 10C are cross-sectional views taken along the lines B-B' and C-C' in FIG. 10A as viewed in the direction of the arrows, respectively.
Figure 10A:
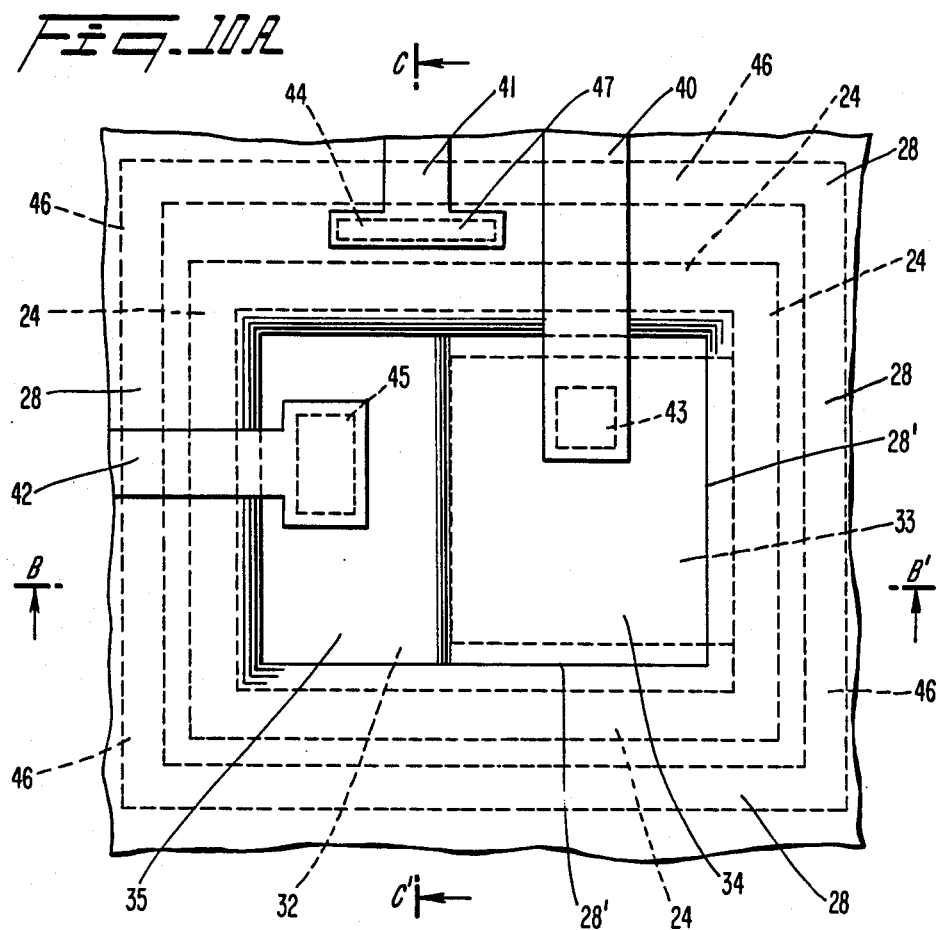
FIG. 10A is a plan view showing an embodiment of the present invention.
Figure 10B:
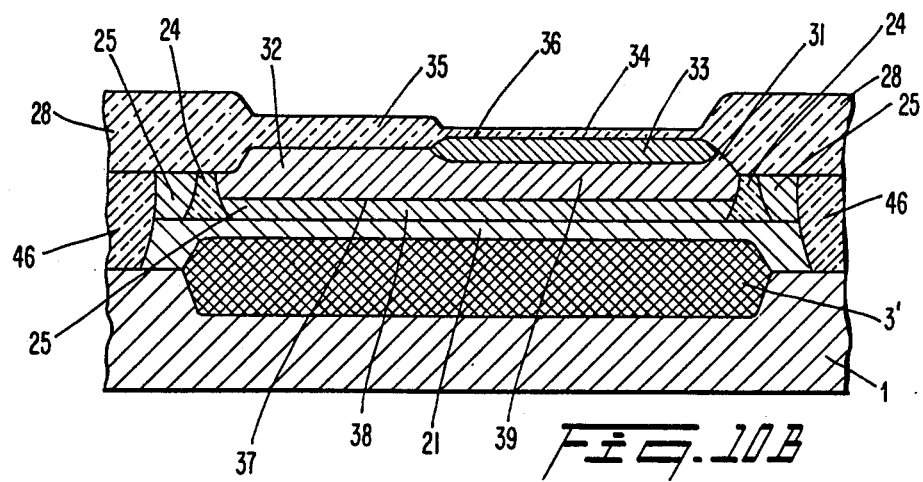

Referring to FIGS. 1 to 4, an N+-type impurity region 3 having a high impurity concentration is formed in a P-type semiconductor body 1 having the impurity concentration of $10^{15}$ atoms/cm$^3$ by using a silicon dioxide film 2 as a mask (see FIGS. 1 and 2). Then, after the silicon di-oxide film 2 is removed, an N-type silicon layer 4 having the impurity concentration of $10^{16}$ atoms/cm$^3$ and the thickness of 4 μm is formed on the P-type body by well-known epitaxial growing method. During this process, the N+-type impurity region is somewhat diffused upwardly into the N-type silicon layer 4, and the N+-type buried layer 3' having the impurity concentration of $10^{19}$ atoms/cm$^3$ is formed within the semiconductor substrate 10 consisting of the semiconductor body 1 and the semiconductor layer 4 (see FIG. 3). Next, as shown in FIG. 4, a thick field silicon oxide layer 5 is thermally formed by using a silicon nitride film (not shown) as a mask. Generally, the thickness of the field layer 5 ranges from 1.2 μm to 1.6 μm, and is partially embedded from the surface 11 into the substrate about 0.5 μm to 0.65 μm. Therefore, the silicon crystal at the portion 12 in the vicinity of the field layer 5 becomes an abnormal state, that is, the portion includes many defects. Thereafter, a P-type base region 7 having the impurity concentration of $10^{17}$ atoms/cm$^3$ and a depth from the surface 11 of 1.0 μm is formed by introducing boron by an ion implantation method at $2.5\times10^{14}/cm^2$, under 100 KeV energy, and conducting drive-in under the condition of 1140° C. and 30 minutes. The PN junction 13 between the base region 7 and the semiconductor layer 4, that is, a collector region has a sharp curvature 14 near the buried field oxide layer 5. Therefore, the breakdown voltage ($BV_{CBO}$) between the base region and the collector region decreases. Namely, when the curvature 14 does not exist, the $BV_{CBO}$ maintain about 60 volt. Nevertheless, the $BV_{CBO}$ in the prior art decreases to about 30 volt because of the sharp curvature 14 of the PN junction. After a silicon oxide layer 6 is provided on a part of the base region 7, an N-type emitter region 8 having the impurity concentration of $10^{18}$ atoms/cm$^3$ and the depth from the surface 11 of 0.3 μm is formed by introducing phosphorus by thermal diffusion method under 980° C. during 15 minutes. Phosphorus is abnormally diffused at the portion 12 near the field insulating layer 5. The base width at the portion 12 becomes, for example, 0.4 μm or less which is a smaller value than the base width 0.7 μm at a in the other portion 15. In the transistor, when $h_{FE}$ ($\beta$) is 100, the breakdown voltage ($BV_{CEO}$) between the emitter region 8 and collector region 4 becomes about 10 volts which is a far smaller value than that of a transistor which maintains a the base width at the portion 12 to 0.5 μm or more, and substantially has no curvature of the PN junction 13. Namely, in the same impurity condition and the same depths of emitter and the PN junction and the base width at the portion 12 near the field insulating layer 5 maintains substantially the same level as at the other portion 15, the $BV_{CEO}$ would be about 20 volts at a condition of $h_{FE}$ being 100.

Referring to FIGS. 5 to 10, the N+-type buried region 3' having the impurity concentration of $10^{19}$ atoms/cm$^3$ is provided between the P-type semiconductor body 1 having the impurity concentration of $10^{15}$ atoms/cm$^3$ and an N-type monocrystalline silicon layer 21 having the impurity concentration of $10^{16}$ atoms/cm$^3$ and the thickness of 2.0 μm. A silicon di-oxide film 22 of 0.5 μm to 1.0 μm in thickness is provided on the silicon layer 21 by thermal oxidation process, chemical vapour deposition (C.V.D.) process, etc., and a photo-resist pattern 23 is provided on the silicon di-oxide film 22 (see FIG. 5). Next, as shown in FIG. 6, a protruded insulating layer 24 is formed from the silicon oxide film 22 through dry or wet isotropic etching process to the silicon oxide film 22 by using the photo-resist pattern 23 as a mask. Favorably, the trapezoid shape of the insulating layer 24 has the bottom width W of 1.0 μm to 2.0 μm and the height e of 0.5 μm to 1.0 μm. Then, an N-type silicon layer 25 of $10^{16}$ atoms/cm$^3$ and having a thickness of about 2.0 μm is deposited on the monocrystalline silicon layer 21 and the prutruded insulating layer 24. In this case, the part of the silicon layer on the monocrystalline silicon layer becomes monocrystalline silicon 25' and the part on and near the protruded insulating layer 24 becomes polycrystalline silicon 25". Then, P-type isolation region 46 is formed around the isolation layer 24 and the active region (see FIG. 7). Next, after a thin silicon oxide film 27 is thermally formed on the surface of the silicon layer 25, a silicon nitride film 26 is selectively provided on the thin silicon oxide film 27 and above an active region, that is, a PN junction forming region of the semiconductor substrate including the silicon body 1, and the silicon layers 21, 25 (see FIG. 8). Then, after the thin silicon oxide film 27 and the silicon layer 25 is selectively etched by using the silicon nitride film 26 as a mask to reduce the thickness of the silicon layer 25 on a field region, a thermal oxidation treatment is conducted to form a field oxide layer 28 having the thickness of 0.5 μm to 0.8 μm. The field oxide layer 28 is embedded into the silicon layer 25 about 0.2 μm to 0.35 μm from an upper surface 29 of the active region of the silicon layer 25 and contacted at its bottom to the upper surface of the protruded insulating layer 24, and the silicon nitride film 26 is removed (see FIG. 9). The field oxide layer 28 has a small thickness and is buried only the small depth into the silicon layer 25. Therefore, silicon crystals at a location 31 near the field oxide layer 28 have only small defects, which do not substantially affect any condition of the impurity diffusion such as phosphorus diffusion. As shown in FIGS. 10A, 10B and 10C, the protruded insulating layer 24 of the present invention has a ring shape in the plan view and surrounds a P-type base region 32. In FIG. 10A, the numeral 28' represents the edge of the field insulating layer 28. The P-type base region 32 is formed by introducing boron, and has the impurity concentration of $10^{17}$ atoms/cm$^3$ and the depth from the surface 36 of 1.0 μm. More particularly, boron is implanted through the thin silicon oxide film 27 of 500 Å thickness by 100 KeV energy at $2.5\times10^{15}/cm^2$ dose density. Thereafter, a heat treatment is conducted to activate the ions and to drive-in the impurity at 1140° C. and during 30 minutes under nitrogen atomosphere. The conditions to form the base region 32 is the same as the prior art shown in FIGS. 1 to 4, and the field oxide layer 28 of 0.5 μm to 0.8 μm can be used as a mask. However, the embedded value of the field insulating layer 28 is so small that boron ions can be laterally diffused along the bottom of the layer 28 at the heat treatment. Therefore, the PN junction 37 between the base region 32 and the collector region 38 of the silicon layer 25 is not terminated to the field insulating layer 28 but to the trapezoid protruded insulating layer 24 with no sharp curvature. Therefore, the breakdown voltage ($BV_{CBO}$) between the base region and the collector region increases such as to about 60 volt. Further, because of the substantially normal crystal state of silicon in the location 31 near the field insulating layer 28, an N-type emitter region 33 having an impurity concentration of $10^{18}$ atoms/cm$^3$ and a depth from the surface 36 of 0.3 μm can be formed by introducing phosphorus without abnormal diffusion phenomenon. The emitter region is FIGS. 1 to 4. Therefore, the base width at the location 31 can be substantially the same level as the base width at the other location 39. In this case, the base width at the other location 39 is 0.7 μm, and the base width at the end location 31 near the field insulating layer 28 becomes 0.5 μm or more. Therefore, the breakdown voltage ($BV_{CEO}$) between the emitter region 33 and the collector region 38 would be increased to 20 volt at a condition of $h_{FE}(\beta)$ being 100. As shown in FIGS. 10A and 10C, after the necessary forming of impurity regions, an emitter electrode 40 is connected to the emitter region 33 through contact hole 43 formed in an insulating film 34, and a base electrode 42 is connected to the base region 32 through contact hole 45 formed in an insulating film 35. The collector region including the silicon layers 21, 25 and the buried region 3' extend outside the ring shape protruded insulating layer 24, and N+ contact region 47 is provided on the surface of the silicon layer 25. The N+ contact region 47 can be formed in the emitter forming process step, and a collector electrode 41 is connected to the N+ contact region 47 through contact hole 44 formed in the insulating layer 28.

What is claimed is:

1. A semiconductor device comprising a semiconductor body of one conductivity type, a first semiconductor layer of the opposite conductivity type formed on said semiconductor body, a second semiconductor layer of said opposite conductivity type formed on said first semiconductor layer and having a PN junction forming region, a first insulating layer selectively formed on the surface of said second semiconductor layer, said first insulating layer being partially embedded in the surface of said second semiconductor layer and surrounding said PN junction forming region of said second semiconductor layer, a second insulating layer formed within said second semiconductor layer between the bottom of said first insulating layer and said first semiconductor layer, said second insulating layer having a trapezoidal cross-sectional shape with an upper face attached to a part of said bottom of said first insulating layer, a lower face and a side face surrounding said PN junction forming region, said upper face being narrower than said lower face and said side face being sloped, and a first impurity region of said one conductivity type formed in said PN junction forming region of said second semiconductor layer such that all of the end portions of the PN junction between said first impurity region and said second semiconductor layer are terminated at said side face of said second insulating layer.

2. A semiconductor device of claim 1, in which said PN junction is substantially flat.

3. A semiconductor device of claim 1, in which said 1 first impurity region is a base region of a bipolar transistor element.

4. A semiconductor device of claim 1 further comprising a second impurity region of said opposite conductivity type formed in said first impurity region, said second impurity region being contacted to said first insulating layer.

5. A semiconductor device of claim 4, in which said second impurity region is an emitter region of a bipolar transistor element.

6. A semiconductor device comprising a semiconductor substrate, a field insulating layer partially buried in said semiconductor substrate and substantially surrounding an active region of said semiconductor substrate, an insulating member having a trapezoidal cross-sectional shape with an upper face attached to a part of a bottom of a peripheral portion of said field insulating layer, a lower face and side faces, said upper face being narrower than said lower face and said side faces being sloped, and an impurity region provided in said active region, said impurity region being formed from a surface of said active region into a predetermined depth of said active region such that the bottom of said impurity region is terminated at one of said side faces of said insulating member.

7. A semiconductor device of claim 6, in which said insulating member has a ring shape in the plan view.

8. A semiconductor device of claim 6, in which said insulating member is made of silicon oxide.

9. A semiconductor device of claim 6, in which said impurity region is a base region of a bipolar transistor.

10. A semiconductor device of claim 6, in which the thickness of field insulating layer ranges from 0.5 $\mu$m to 0.8 $\mu$m, and buried from the surface of semiconductor substrate from 0.2 $\mu$m to 0.35 $\mu$m.

11. A semiconductor device of claim 6, in which the width of said lower face of said insulating member ranges from 1.0 $\mu$m to 2.0 $\mu$m, and the height of said insulating member between said upper and lower faces ranges from 0.5 $\mu$m to 1.0 $\mu$m.

* * * * *

UNITED STATES PATENT AND TRADEMARK OFFICE
CERTIFICATE OF CORRECTION

PATENT NO. : 4,860,082

DATED : August 22, 1989

INVENTOR(S) : Masatoshi Moriyama, et al.

It is certified that error appears in the above-identified patent and that said Letters Patent is hereby corrected as shown below:

On the title page, Item [75], second inventor name should read

--Masaaki Ohira--

Signed and Sealed this

Twelfth Day of June, 1990

*Attest:*

HARRY F. MANBECK, JR.

*Attesting Officer*          *Commissioner of Patents and Trademarks*